United States Patent
Toyoda et al.

(10) Patent No.: US 6,426,457 B1
(45) Date of Patent: *Jul. 30, 2002

(54) APPARATUS AND METHOD FOR SHIELDING ELECTROMAGNETIC WAVE

(75) Inventors: Junichi Toyoda, Tokyo; Sakan Iwashita, Kanagawa, both of (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/292,833

(22) Filed: Apr. 16, 1999

(30) Foreign Application Priority Data

Apr. 27, 1998 (JP) .......................................... 10-116623

(51) Int. Cl.[7] ................................................ H05K 9/00
(52) U.S. Cl. ............................. 174/35 R; 174/35 MS; 361/800; 361/816; 361/818
(58) Field of Search ................................ 361/816, 818, 361/799, 800, 752, 753; 174/35 R, 35 CE, 35 MS; 206/719, 720, 721

(56) References Cited

U.S. PATENT DOCUMENTS

| | | | |
|---|---|---|---|
| 4,684,020 A | * 8/1987 | Ohlbach | 206/328 |
| 4,848,566 A | * 7/1989 | Havens et al. | 206/328 |
| 5,171,936 A | * 12/1992 | Suzuki et al. | 174/35 MS |
| 5,406,026 A | * 4/1995 | Yamaguchi et al. | 174/35 R |
| 5,508,889 A | * 4/1996 | Ii | 361/816 |
| 5,827,585 A | * 10/1998 | Gianetti | 428/36.2 |

FOREIGN PATENT DOCUMENTS

| | | | |
|---|---|---|---|
| JP | 63-268299 | * 11/1988 | |
| JP | 1-155691 | * 6/1989 | |
| JP | 5-21984 | * 1/1993 | |
| JP | 6-61679 | * 3/1994 | 174/35 MS |
| JP | 11-81051 | * 3/1999 | |

OTHER PUBLICATIONS

Serway, Physics for Scientists and Engineers, 1990, p. 877.*

* cited by examiner

Primary Examiner—Dean A. Reichard
Assistant Examiner—Carmelo Oliva
(74) Attorney, Agent, or Firm—Sonnenschein, Nath & Rosenthal

(57) ABSTRACT

Disclosed is an electromagnetic wave shielding apparatus for shielding electromagnetic waves generated from a circuit so as to prevent the electromagnetic waves from being leaked to the outside of the circuit. The apparatus includes a metal member disposed in such a manner as to be opposed to the circuit, and an electromagnetic wave absorbing member disposed on the metal member, wherein the electromagnetic absorbing member is composed of a carbon layer and coil-like carbon fiber structures. The apparatus is allowed to simply obtain an electromagnetic wave absorbing function without increasing the weight of the apparatus.

8 Claims, 4 Drawing Sheets

APPARATUS AND METHOD FOR SHIELDING ELECTROMAGNETIC WAVE

RELATED APPLICATION DATA

The present application claims priority to Japanese Application No. P10-116623 filed Apr. 27, 1998 which application is incorporated herein by reference to the extent permitted by law.

BACKGROUND OF THE INVENTION

The present invention relates to an electromagnetic wave shielding apparatus and an electromagnetic wave shielding method used for electric circuits, electronic circuits and the like.

In electric circuit arrangements, electronic circuit arrangements and the like, it is necessary to prevent electromagnetic waves generated from electronic parts and the like installed in the circuit arrangement from being leaked to the outside. For example, a circuit board 100 of a related art electronic circuit arrangement shown in FIG. 7 has electronic parts 101 and 102 which generate electromagnetic waves 103 in the directions shown by the arrows, and which circuit board 100 is covered with a case 104. In this case, the electromagnetic waves 103 are reflected from the inner surfaces of the case 104 and leaked to the outside through a small gap 105 and/or wiring. The case 104, if being made from a metal, produces a high-frequency current when it is exposed to the electromagnetic waves, and therefore, the case 104 becomes a re-generating source of electromagnetic wave noise.

To cope with such an inconvenience, in the related art electronic circuit arrangement, as shown in FIG. 8, an electromagnetic wave absorbing member 110 is fixed on a surface, facing to the electronic parts, of the inner wall of the case 104. The electromagnetic wave absorbing member 110 functions to absorb or attenuate the electromagnetic waves 103 and prevent leakage of the electromagnetic waves 103 to the outside as much as possible, to reduce the degree of reflection of the electromagnetic waves 103 and decay the electromagnetic waves 103, and to prevent re-generating of electromagnetic wave noise from the case 104.

The related art electromagnetic wave absorbing member 110, however, has disadvantages that it takes a lot of time to lay out the member 110 because the member 110 must be stuck on the inner surface of the shield case 104 with an adhesive double coated tape or the like by an operator in such a manner as to ensure the optimum absorption of electromagnetic waves, and that the weight of the circuit board 100 becomes very large because the member 110 having a large thickness is stuck on the inner surface of the case 104 with an adhesive double coated tape or the like.

SUMMARY OF THE INVENTION

An object of the present invention is to provide an electromagnetic wave shielding apparatus and an electromagnetic wave shielding method, which are capable of simply obtaining an electromagnetic wave shielding function without increasing the weight of the apparatus.

To achieve the above object, according to a first aspect of the present invention, there is provided an electromagnetic wave shielding apparatus for shielding electromagnetic waves generated from a circuit so as to prevent the electromagnetic waves from being leaked to the outside of the circuit, including: a metal member disposed in such a manner as to be opposed to the circuit; and an electromagnetic wave absorbing member disposed on the metal member; wherein the electromagnetic absorbing member is composed of a carbon layer and coil-like carbon fiber structures.

With this configuration, since the electromagnetic wave absorbing member is composed of the carbon layer and the coil-like carbon fiber structures which are formed on the metal member, it can be made lighter than that of the related art electromagnetic wave absorbing member, and since the coil-like carbon fiber structures are electrically conductive, the electromagnetic wave absorbing member is capable of efficiently absorb electromagnetic waves generated from an electromagnetic wave generating source through the coil-like carbon fiber structures.

In the above apparatus, preferably, the carbon layer is formed on a surface, facing to the circuit, of the metal members; one-end portions of the coil-like carbon fiber structures are connected to the carbon layer; and the axial directions of the coil-like carbon fiber structures are substantially perpendicular to an electromagnetic wave generating source. With this configuration, electromagnetic waves generated from an electromagnetic wave generating source can be efficiently absorbed in the carbon layer through the coil-like carbon fiber structures.

According to a second aspect of the present invention, there is provided an electromagnetic wave shielding method for shielding electromagnetic waves generated from a circuit so as to prevent the electromagnetic waves from being leaked to the outside of the circuit, including the steps of: forming an electromagnetic wave absorbing member on a metal member; and disposing the metal member in such a manner that the metal member is opposed to the circuit; wherein the electromagnetic wave member is composed of a carbon layer and coil-like carbon fiber structures produced by a chemical vapor deposition process based on thermal decomposition.

With this configuration, the electromagnetic wave absorbing member can be simply formed on the metal member by chemical vapor deposition, being made lightweight, and is capable of efficiently absorb electromagnetic waves.

In the above method, preferably, the carbon layer is formed on a surface, facing to the circuit, of the metal members; one-end portions of the coil-like carbon fiber structures are connected to the carbon layer; and the axial directions of the coil-like carbon fiber structures are substantially perpendicular to an electromagnetic wave generating source.

With this configuration, since the electromagnetic wave absorbing member is composed of the carbon layer and the coil-like carbon fiber structures which are formed on the metal member, it can be made lighter than that of the related art electromagnetic wave absorbing member, and since the coil-like carbon fiber structures are electrically conductive, the electromagnetic wave absorbing member is capable of efficiently absorb electromagnetic waves generated from an electromagnetic wave generating source through the coil-like carbon fiber structures.

According to the present invention, a shield case for shielding a circuit can be simply prepared by working the metal member on which the electromagnetic wave absorbing member has been formed, into a desired shape.

DETAILED DESCRIPTION OF THE PREFERRED EMBODIMENT

Hereinafter, one preferred embodiment of the present invention will be described with reference to the accompanying drawings.

Figure 1:
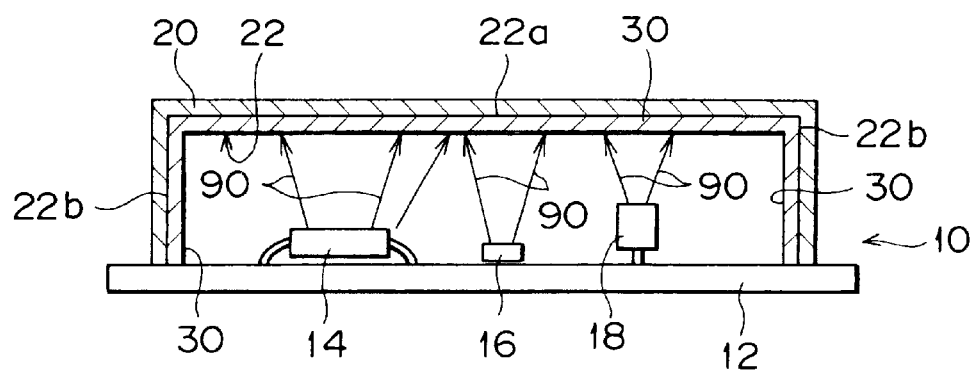
FIG. 1 is a schematic view showing one example of a circuit board including an electromagnetic wave shielding apparatus according to the present invention.

FIG. 1 shows a circuit board 12 on which an electromagnetic wave shielding apparatus 10 of the present invention is mounted. The circuit board 12 has a conductor pattern of an electric or electronic circuit, and for example, electronic parts 14, 16 and 18 are electrically connected to the conductor pattern.

A box-shaped shield case 20 is, having at least one wall, mounted on the circuit board 12 in such a manner as to cover the electronic parts 14, 16 and 18.

Figure 2:
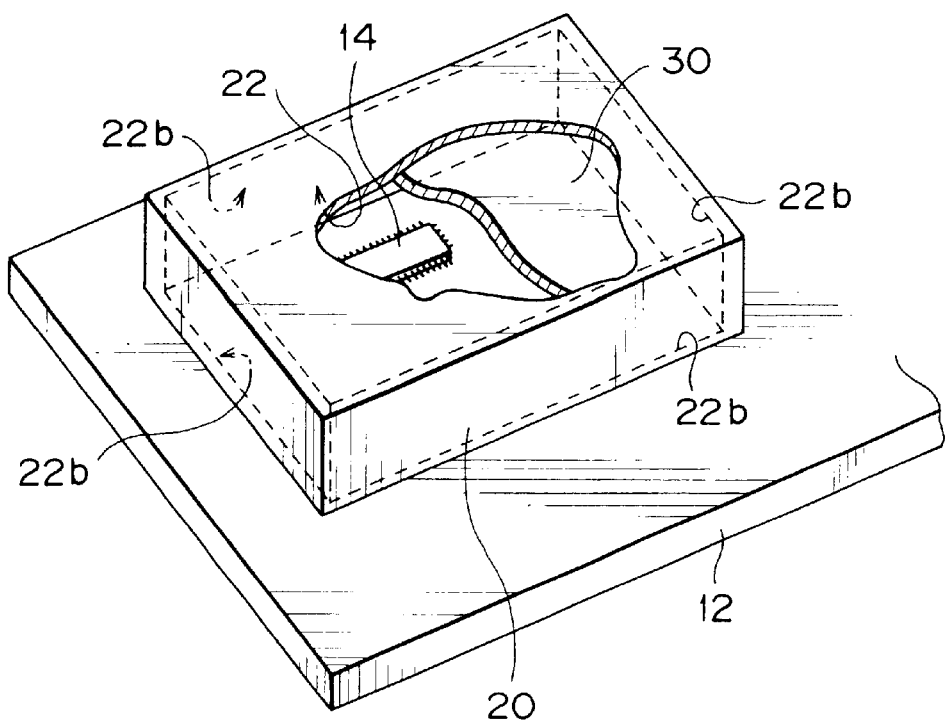
FIG. 2 is a perspective view, with parts partially cutaway, showing the circuit board including the electromagnetic wave shielding apparatus shown in FIG. 1.

An electromagnetic wave absorbing member 30 is formed over an inner surface 22 of the shield case 20. The electromagnetic wave absorbing member 30 is formed, as shown in FIGS. 1 and 2, into a sheet composed of, as shown by the partial enlarged view of FIG. 3, a carbon layer 60 and numberless coil-like carbon fiber structures (may be called carbon coils) 40. The coil-like carbon fiber structures 40, substantially parallel to each other, are formed on the carbon layer 60 in the direction substantially perpendicular thereto. To be more specific, one-end sides 41 of the coil-like carbon fiber structures 40 are connected to the carbon layer 60 and the other end sides thereof are taken as free ends or entangled with each other. The coil-like carbon fiber structures are also called helical coil-like carbon fiber structures, which are basically composed of carbon fibers produced by thermal decomposition of a hydrocarbon gas. One example of the coil-like carbon fiber structure 40 will be described with reference to FIG. 5.

Figure 5:
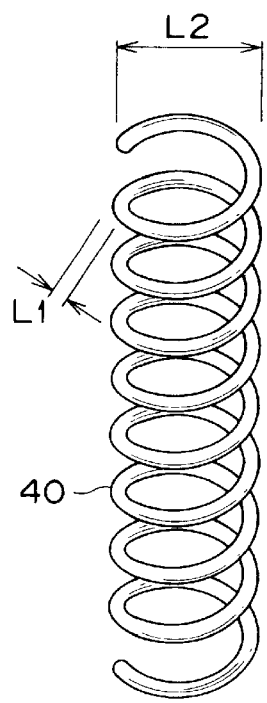
FIG. 5 is a perspective view showing one example of the coil-like carbon fiber structure.

The coil-like carbon fiber structure 40 shown in FIG. 5 is electrically conductive. The fiber diameter (fiber thickness) L1 of the fiber structure 40 is in a range of 0.05 to 5 $\mu$m. The coil outside diameter L2 of the coil structure 40 is about 2 to 10 times greater than the fiber diameter L1, that is, in a range of 0.1 to 50 $\mu$m. The axial length of the fiber structure 40 is in a range of 3 to 30 $\mu$m. The number of turns of the fiber structure 40 is in a range of about 1 to 500. Further, the number of turns×(unit length (10 $\mu$m)/coil outside diameter L2) is in a range of 5 to 50.

The coil-like carbon fiber structures 40 having the above configuration, which are essentially made from carbon, can be obtained by vapor-phase thermal decomposition of a gas containing a hydrocarbon based gas, particularly, acetylene gas, in a system in which a transition metal is present, at a temperature ranging from 700 to 800° C.

Examples of the above hydrocarbon based gases may include an unsaturated hydrocarbon gas such as acetylene, ethylene, or propylene gas and a saturated hydrocarbon gas such as ethane, propane, or butane gas. In particular, acetylene gas is most preferably used from the viewpoint of the catalytic action of a transition metal.

The above hydrocarbon gas may be mixed with hydrogen. In addition to this, a diluting gas such as argon, nitrogen, or helium can be of course used for controlling the shape of the coil-like carbon fiber structure 40.

Figure 3:
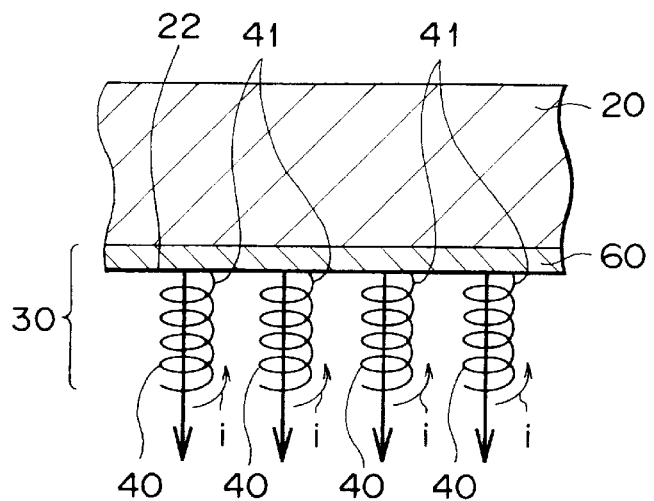
FIG. 3 is an enlarged sectional view showing a shield case and an electromagnetic wave absorbing member.

One example of a method of forming the electromagnetic wave absorbing member 30, which is composed of the carbon layer 60 and the coil-like carbon fiber structures 40 as shown in FIG. 3, on the inner surface 22 of the shield case 20 will be described with reference to FIGS. 4 and 6.

A plate-like raw material 74, which will be taken as a flat-plate shield case 20, is first prepared. The plate-like raw material 74 is made from a conductive material such as iron, nickel, copper or permalloy and has a thickness ranging from 0.1 to 0.5 mm.

Figure 6:
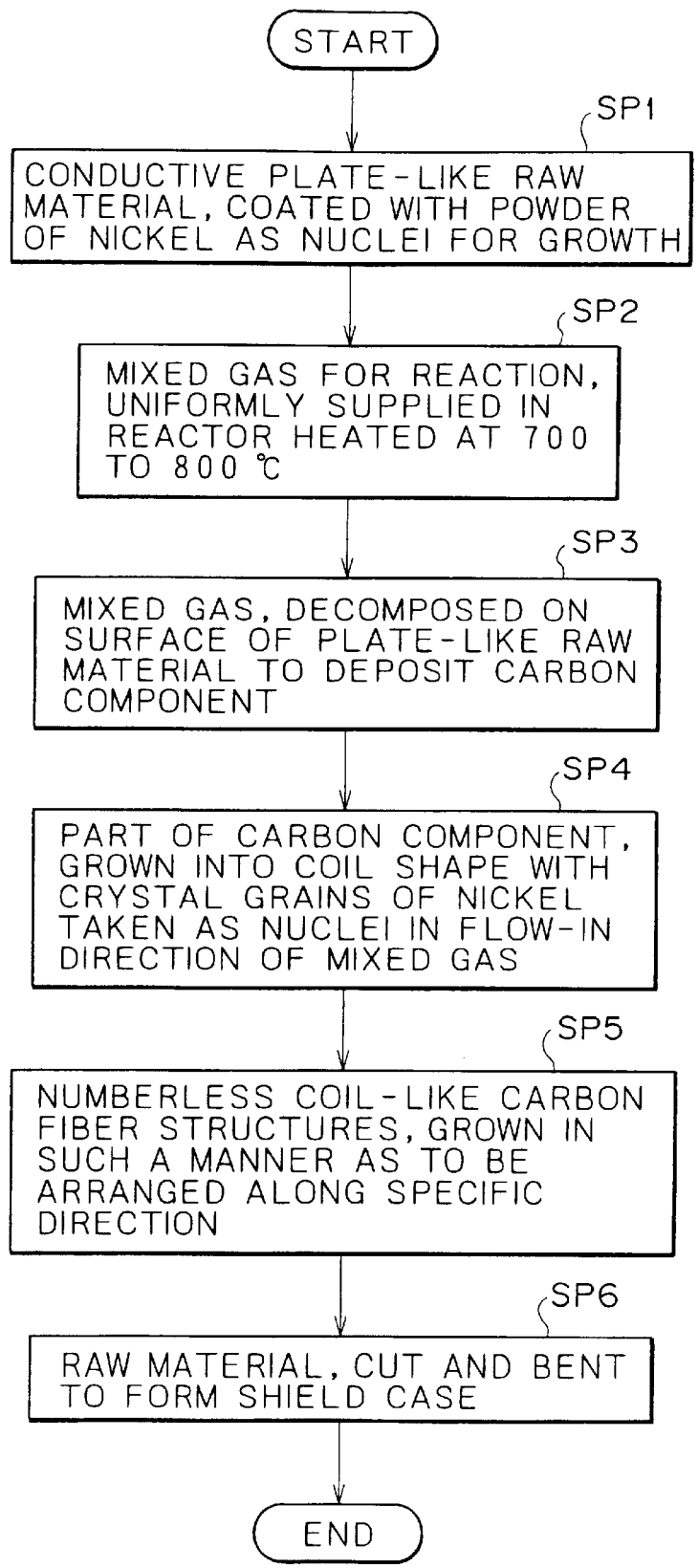
FIG. 6 is a flow chart showing one example of a method of forming coil-like carbon fiber structures on a plate-like raw material.
Figure 7:
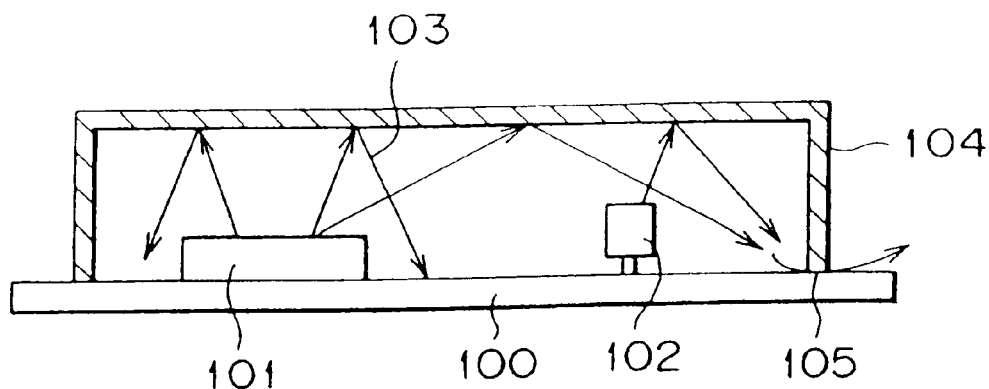
FIG. 7 is a schematic view showing a circuit board including a related art shield case.
Figure 8:
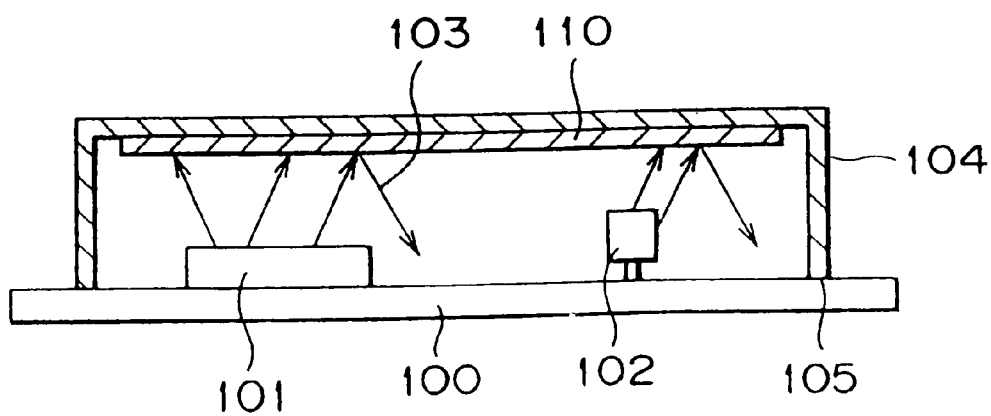
FIG. 8 is a schematic view showing a circuit board including a related art shield case having an electromagnetic wave absorbing member.

Next, at step SP1 in FIG. 6, the plate-like raw material 74 for forming the shield case 20 is coated with powder 76 of nickel as nuclei for growth of coil-like carbon fiber structures 40 on the conductive plate-like raw material 74. The powder 76 of nickel has an average particle size of about 5 $\mu$m. The plate-like raw material 74 coated with the powder 76 of nickel is mounted on a susceptor 72 in a reactor 70 shown in FIG. 4. At step SP2, the plate-like raw material 74 coated with the powder 76 of nickel is heated in the reactor 70 at a temperature ranging from 700 to 800° C., and at the same time, a reaction gas 80 is uniformly supplied to the plate-like raw material 74 from a gas inlet 78. To be more specific, a mixed gas of acetylene, hydrogen and chiophene as the reaction gas is allowed to flow to the powder 76 of nickel on the plate-like raw material 74 through a special shower head.

The mixed gas (reaction gas) thus supplied is decomposed on the surface of the plate-like raw material 74. Thus, at step SP3, a carbon component is deposited as a carbon layer 60 shown in FIG. 3. At step SP4, part of the carbon component is grown in vapor-phase, with crystal grains of nickel taken as nuclei, on the carbon layer 60 formed on the plate-like raw material 74 in the direction substantially perpendicular thereto, to form coil-like carbon fiber structures 40. To be more specific, the coil-like carbon fiber structures 40 grow toward the flow-in direction of the reaction gas 80.

Figure 4:
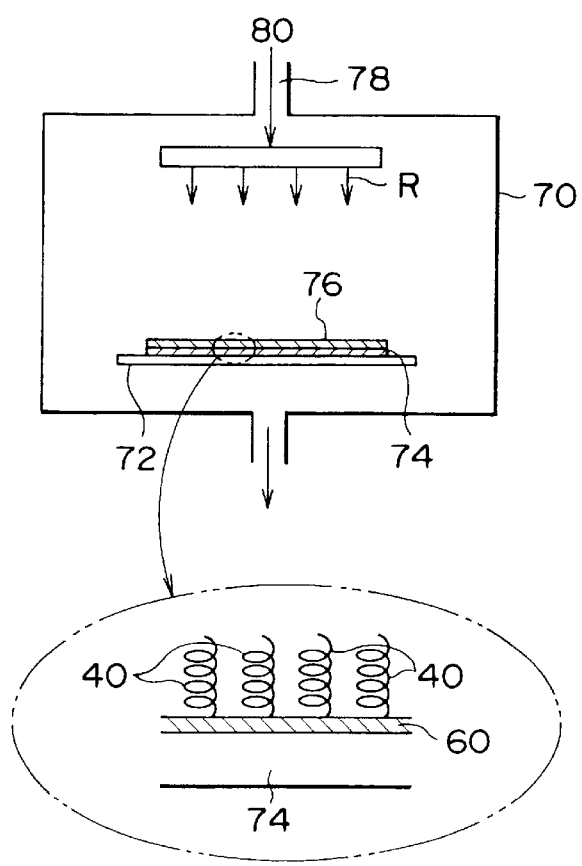
FIG. 4 is a schematic view showing one example of a method of forming a carbon layer and coil-like carbon fiber structures on a plate-like raw material of the shield case by chemical vapor deposition.

At step SP5, the numberless coil-like carbon fiber structures 40 grow in such a manner as to be arranged along a specific direction as shown in FIGS. 3 and 4. In this case, it is important that the reaction gas 80 uniformly flows in the direction R, that is, in the direction perpendicular, or substantially perpendicular to the plate-like metal raw material 74.

At step SP6, the plate-like raw material 74 formed as shown in FIG. 4, which is removed from the reactor 70, is cut into a specific dimension and is bent to form a shield case 20 shown in FIGS. 1 and 2. In this way, the electromagnetic wave absorbing member 30 is formed over the inner surface 22 of the shield case 20.

Electromagnetic waves generated from the electronic parts 14, 16 and 18 shown in FIG. 1, which are the electromagnetic wave generating sources, is made incident on each of the coil-like carbon fiber structures 40 shown in FIG. 3 in the axial direction thereof. At this time, the coil-like carbon fiber structure 40 produces an induction current "i". Since the coil-like carbon fiber structure 40 is positioned substantially perpendicularly to the electronic parts 14, 16 and 18 as the electromagnetic wave generating sources, it receives the electromagnetic waves (variable magnetic field) in the axial direction and introduces these electromagnetic waves to the carbon layer 60. The carbon layer 60 absorbs the electromagnetic waves thus introduced by the coil-like carbon fiber structures 40.

Since the electromagnetic wave absorbing member 30 can be formed over the inner surface 22 of the shield case 20, it can absorb the electromagnetic waves 90 without leakage thereof to the outside. That is to say, the electromagnetic wave absorbing member 30 is desirable to be formed on a widest first surface 22a and four side surfaces 22b of the inner surface 22 as shown in FIGS. 1 and 2.

Since the electromagnetic wave absorbing member 30 can be formed over the inner surface of the shield case 20 by chemical vapor deposition, the present invention has the following merits:

(1) Unlike the related art electromagnetic wave absorbing member stuck on the metal member with an adhesive double coated tape, the electromagnetic wave absorbing member 30 is formed over the inner surface 22 of the shield case 20 by chemical vapor deposition, and accordingly, it is possible to thinly form the electromagnetic wave absorbing member 30 and to eliminate the fear that the member 30 is peeled from the inner surface of the shield case 20.

(2) The period of time required for layout of the electromagnetic wave absorbing member 30 can be shortened. That is to say, since the leakage level of electromagnetic waves to the outside is lowered, the margin of the circuit design is increased and thereby the final adjustment of the circuit can be omitted.

(3) Since the electromagnetic wave absorbing member 30 is stuck on the metal member by chemical vapor deposition (CVD) based on thermal decomposition, it is possible to thinly form the member 30, to eliminate the sticking work using an adhesive double coated tape, and to reduce the weight of the member 30.

(4) Since the electromagnetic wave absorbing member 30 can be formed at a time over the inner surface 22 of the shield case 20, it is possible to increase the ability of preventing the leakage of the electromagnetic waves 90 to the outside.

In the above embodiment, description is made by way of the example in which the box-shaped shield case 20 is disposed on an electric or electronic circuit board; however, the shape of the shield case 20 and the shape of the electromagnetic wave absorbing member 30 formed on the shield case 20 are not limited to those shown in the figures.

In the example shown in the figures, the coil-like carbon fiber structures 40 are formed in the directions perpendicular or substantially perpendicular to the inner surface of the shield case 20; however, the present invention is not limited thereto. For example, the coil-like carbon fiber structures 40 may be slightly tilted with respect to the inner surface of the shield case 20. In this case, the same effect can be obtained.

The electromagnetic wave absorbing member 30 may be formed by tightening the coil-like carbon fiber structures by means of a non-conductive material such as rubber or plastic.

While the preferred embodiment has been described using specific terms, such description is illustrative purposes only, and it is to be understood that changes and variations may be made without departing from the spirit or scope of the following claims.

What is claimed is:

1. An electromagnetic wave shielding apparatus for shielding electromagnetic waves generated from a circuit so as to prevent the electromagnetic waves from being leaked to the outside of the circuit, comprising:
    a wall having an inner surface facing the circuit; and
    an electromagnetic wave absorbing member having a carbon layer and a plurality of coil-like carbon fiber structures electrically connected to the carbon layer, the electromagnetic wave absorbing member being disposed on the inner surface of the wall so that the plurality of coil-like carbon fiber structures extend from the carbon layer.

2. An electromagnetic wave shielding apparatus according to claim 1, wherein the carbon layer of the electromagnetic wave absorbing member is formed on the inner surface of the wall.

3. An electromagnetic wave shielding apparatus according to claim 2, wherein one-end of each of the plurality of coil-like carbon fiber structures are connected to the carbon layer of the electromagnetic wave absorbing member.

4. An electromagnetic wave shielding apparatus according to claim 3, wherein each of the plurality of coil-like carbon fiber structures has an axial direction that is substantially perpendicular to the circuit.

5. An electromagnetic wave shielding apparatus according to claim 1, wherein the wall comprises a conductive material.

6. An electromagnetic wave shielding apparatus according to claim 5, wherein the conductive material is metal.

7. An electromagnetic wave shielding apparatus according to claim 1, wherein each of the plurality of coil-like carbon fiber structures is formed on the carbon layer of the electromagnetic wave absorbing member.

8. An electromagnetic wave shielding apparatus for shielding electromagnetic waves generated from a circuit, comprising:
    a shield case having an inner surface facing the circuit; and
    an electromagnetic wave absorbing member disposed on the inner surface, the electromagnetic wave absorbing member having a carbon layer and a plurality of coil-like carbon fiber structures formed to extend from the carbon layer.

* * * * *